United States Patent [19]
McKenna et al.

[11] Patent Number: 5,713,711
[45] Date of Patent: Feb. 3, 1998

[54] MULTIPLE INTERFACE DOOR FOR WAFER STORAGE AND HANDLING CONTAINER

[75] Inventors: Douglas B. McKenna, Dover, Del.; Donald R. Briner, Austin, Tex.; Christopher D. Laramore, San Jose, Calif.

[73] Assignee: Bye/Oasis, Austin, Tex.

[21] Appl. No.: 373,347

[22] Filed: Jan. 17, 1995

[51] Int. Cl.⁶ .................................................. B65G 49/07
[52] U.S. Cl. ........................... 414/217; 414/416; 414/940
[58] Field of Search ................................. 414/217, 292, 414/416, 937, 940; 220/254, 346; 206/710, 711

[56] References Cited

U.S. PATENT DOCUMENTS

| | | | |
|---|---|---|---|
| Re. 34,311 | 7/1993 | Millis et al. | 414/217 |
| 4,431,361 | 2/1984 | Bayne | 414/405 |
| 4,520,925 | 6/1985 | Johnson | 206/334 |
| 4,532,970 | 8/1985 | Tullis et al. | 141/98 |
| 4,534,389 | 8/1985 | Tullis | 141/98 |
| 4,540,326 | 9/1985 | Southworth et al. | 414/217 |
| 4,557,957 | 12/1985 | Manniso | 428/36 |
| 4,582,219 | 4/1986 | Mortensen et al. | 220/326 |
| 4,636,128 | 1/1987 | Millis et al. | 414/217 |
| 4,660,464 | 4/1987 | Tanaka | 98/115.3 |
| 4,667,579 | 5/1987 | Daw | 98/33.1 |
| 4,674,936 | 6/1987 | Bonora | 414/217 |
| 4,674,939 | 6/1987 | Maney et al. | 414/292 |
| 4,676,144 | 6/1987 | Smith, III | 98/1.5 |
| 4,676,709 | 6/1987 | Bonora et al. | 414/217 |
| 4,684,021 | 8/1987 | Niebling et al. | 206/334 |
| 4,687,542 | 8/1987 | Davis et al. | 156/643 |
| 4,705,444 | 11/1987 | Tullis et al. | 414/226 |
| 4,709,834 | 12/1987 | Mortensen et al. | 220/326 |
| 4,739,882 | 4/1988 | Parikh et al. | 206/454 |
| 4,744,715 | 5/1988 | Kawabata | 414/331 |
| 4,746,256 | 5/1988 | Boyle et al. | 414/217 |

(List continued on next page.)

FOREIGN PATENT DOCUMENTS

| | | |
|---|---|---|
| 0138473 | 4/1985 | European Pat. Off. . |
| 0267507 | 5/1988 | European Pat. Off. . |
| 0 570 967 | 11/1993 | European Pat. Off. . |
| 0 626 724 | 11/1994 | European Pat. Off. . |
| 4326309 | 9/1994 | Germany .................. 414/940 |
| 2284441 | 11/1990 | Japan ......................... 414/940 |
| 87/04414 | 7/1987 | WIPO . |
| 8809563 | 12/1988 | WIPO . |
| 92/07759 | 5/1992 | WIPO . |
| 3018543 | 9/1993 | WIPO ........................ 414/940 |

OTHER PUBLICATIONS

Literature: "Carry Out Rapid Transfers With Complete Safety;" SNE la Calhene; May 1988.
Literature: "A Technology for Wafer Cassette Transfer in VLSI Manufacturing;" Solid State Technology; vol. 27, No. 7, Jul. 1984, Washington, US pp. 111–115.

*Primary Examiner*—James W. Keenan

[57] ABSTRACT

The present invention is an improved container and interface for transporting or otherwise handling contamination-sensitive materials, such as semi-conductor wafers during processing. The container of the present invention employs a door-within-a-door design, allowing the container to connect with different interfaces on a single side. Employing a container of the present invention, manufacturers may connect a single container to different tools or mini-environments employing incompatible interfaces without the need to use different containers or to access the contents of a single container from different directions. The present invention is particularly useful in instances where a single interface standard, e.g., SEMI Standard SMIF interfaces, has not been uniformly adopted in a facility. The present invention also provides means which allow either a cassette container or a cassette to be directly placed on an indexer and subsequent indexing to the correct location This is also useful in instances where a facility has not uniformly adopted SMIF technology, and requires the flexibility to load both cassettes and SMIF containers on the same tool.

11 Claims, 13 Drawing Sheets

U.S. PATENT DOCUMENTS

| | | | |
|---|---|---|---|
| 4,770,680 | 9/1988 | Machida et al. | 55/385.1 |
| 4,781,511 | 11/1988 | Harada et al. | 414/416 X |
| 4,802,809 | 2/1989 | Bonora et al. | 414/217 |
| 4,804,086 | 2/1989 | Grohrock | 206/710 |
| 4,815,912 | 3/1989 | Maney et al. | 414/217 |
| 4,816,638 | 3/1989 | Ukai et al. | 219/121.43 |
| 4,859,137 | 8/1989 | Bonora et al. | 414/648 |
| 4,900,214 | 2/1990 | Ben | 414/416 |
| 4,923,353 | 5/1990 | Tullis et al. | 414/226 |
| 4,934,767 | 6/1990 | Hoyt, III et al. | 312/330.1 |
| 4,963,069 | 10/1990 | Wurst et al. | 414/416 |
| 4,995,430 | 2/1991 | Bonora et al. | 414/940 X |
| 5,024,329 | 6/1991 | Grohrock | 206/454 |
| 5,056,875 | 10/1991 | Akins | 312/1 |
| 5,107,990 | 4/1992 | Wicherski et al. | 220/346 X |
| 5,139,459 | 8/1992 | Takahashi et al. | 454/187 |
| 5,226,781 | 7/1993 | Glachet et al. | 414/217 |
| 5,337,911 | 8/1994 | Holub | 220/254 |
| 5,378,107 | 1/1995 | Vierny et al. | 414/940 X |
| 5,390,785 | 2/1995 | Garric et al. | 206/710 X |
| 5,482,161 | 1/1996 | Williams et al. | 206/711 |
| 5,484,483 | 1/1996 | Kyogoku | 414/940 X |

MULTIPLE INTERFACE DOOR FOR WAFER STORAGE AND HANDLING CONTAINER

BACKGROUND OF THE INVENTION

1. Field of the Invention

The present invention relates to containers for handling semiconductor wafers, and more particularly to containers for transporting and storing wafer carriers while maintaining a clean environment.

2. Description of Related Art

The manufacturing of integrated circuits (ICs) requires an extremely clean environment. ICs are typically manufactured on thin slices of semiconductor materials, such as silicon, called "wafers." The fine circuit patters are fabricated onto the wafer through a sequence of many process steps. These steps are very sensitive to particulate contamination as even very small particles of dust can interfere with the fabrication process and cause defects in the IC. Since particle related defects directly impact the costs of production, increasing the cleanliness of the manufacturing environment has achieved increased productivity by producing higher yields of ICs.

Each process step is performed in sequence by a particular piece of equipment or "tool." The wafers are normally transported between tools in carriers (cassettes) that hold many wafers, typically 25, in parallel slots. Thus, upon completion of one process, the cassette of wafers is transported to the next tool for further processing.

A conventional clean room is one method for providing a clean manufacturing environment. Special equipment circulates filtered air throughout the entire room housing process tools. Personnel working in the room wear special clothing to reduce the particle contamination from themselves. The wafers are processed and transported between tools without leaving the clean room environment. The disadvantages of clean rooms, however, are many. These special rooms are expensive to construct and maintain, and typically encompass very large areas making it difficult to maintain utmost cleanliness. Furthermore, even though specially clothed, the personnel working within the clean rooms are a constant source of particle contamination.

A major improvement over the clean room is the Standard Mechanical Interface (SMIF) system that incorporates the concept of clean mini-environments. Details of a SMIF system are described in the article "SMIF: A TECHNOLOGY FOR WAFER CASSETTE TRANSFER IN VLSI MANUFACTURING," by Mihir Padkh and Uldch Kaempf, *Solid State Technology*, July 1984, pp. 111–115. Each tool or piece of equipment is enclosed within its own small clean environment. Once inside the clean environment of a particular tool, wafers can be manipulated by automated equipment or by personnel using sterile glove ports to reach within. It has been found that such small mini-environments, having particle free air with no internal source of particulates, provide the cleanest possible environment for manufacturing wafers. Moreover, since the cleanliness of the mini-environment is independent of the external environment, IC manufacturing can proceed in a non-clean facility. The expense and inconvenience of a large clean room is eliminated and process yields of ICs are improved due to the lower concentration of particulate contamination.

A SMIF system comprises three main components:

(1) A small clean environment surrounding the wafer handling mechanism of each process tool. This is typically provided by a canopy over the tool or port through which the cassette of wafers passes into the tool. The canopy isolates the internal environment of the tool from the outside, creating a clean environment for wafer processing.

(2) A small contamination free container or pod (SMIF box) for transporting and or storing a cassette of wafers. The pod maintains a clean environment within.

(3) A mechanical interface whereby the door on the container is designed to mate with the access door of an interface port on the equipment canopy such that the two doors can be opened simultaneously and moved as a unit into the clean interior space, trapping any particles on the external door surfaces between the doors. A particle free interface is thus created whereby the cassette can be transferred between the container and canopy while maintaining a clean environment in both.

In a SMIF system, the container is placed on top of the interface port located on a top area of the tool canopy. Latches release the bottom door on the container and the canopy port access door simultaneously. Because the outside of the container door mates with the outside of the canopy interface port door, most of the particles on the outside of the door are trapped between the two doors. A mechanical elevator lowers the two mated doors, with the cassette riding on top of the doors, into the canopy enclosed mini-environment of the tool. A manual or automated manipulator picks up the cassette and positions it for processing. After processing, the reverse operation takes place, placing the cassette back into the pod for transport to the next tool or for storage.

Semiconductor Equipment and Materials International (SEMI), a consortium of IC manufacturers, has promulgated standards (hereinafter referred to as the "SEMI-Standards") for the interface port and container door of the SMIF system. The SEMI-Standards provide a uniform industry standard so that containers and tool canopy interfaces of different manufacturers can be compatible. One such standard is SEMI E19, 4-92, 200MM "STANDARD MECHANICAL INTERFACE (SMIF)" published in 1992.

While the present SMIF system has proved effective in providing extremely clean environments for fabricating ICs, improvements to the container are needed to improve the system's utility and increase its cleanliness. Present SMIF containers have a lower door designed for a specific interface system such as the SEMI-Standard. The interface of each and every clean environment or tool canopy in a particular manufacturing line must be compatible with this one interface so that the wafers can be transported from tool to tool for processing. Installation of an improved or different interface would require the changing of all tool interfaces to maintain compatibility. The prohibitive cost of changing all clean environments simultaneously to a new interface has restricted the development of improved interface systems.

Additionally, the bottom door container has inherent ergonomic problems. Since the cassette is lowered into the clean environment through a bottom door, the container must connect to a clean environment through a top surface area. As a result, personnel transporting containers between tools must lift the containers to the top of canopies. As a repetitive task, this can be straining and tiring to workers. Moreover, although 6 inch diameter wafers are presently used, the industry is presently switching to heavier 8 inch wafers to increase the number of ICs fabricated on a single wafer. The increased bulk and weight of 8 inch wafer cassettes only compound the already difficult ergonomic problems.

One solution proposed to compensate for these ergonomic problems employs a clean environment canopy with an extension or addition having a lower top portion. Once the cassette is lowered within, a robot device raises the cassette to the elevation necessary for the process tool. Such robots, however, are expensive to purchase and maintain. Another solution is an automated device located outside the clean environment canopy that raises the pod from a lower height to the interface port on top of the canopy. This too, however, is expensive to manufacture and maintain.

In U.S. Pat. No. 5,570,987, by McKenna, it is disclosed that the above identified problems can be addressed by providing a wafer transport pod having multiple interface doors. In this manner, the pod can be attached to a SMIF device through a conventional SEMI standard interface, and can be attached to one or more other interfaces through the use of other interface doors located on the side of the pod. Thus, multiple interfaces can be provided on a single pod that provide many options for use of a single pod today while supplying far greater flexibility to address changes in mini-environment interfaces in the future without the need to replace every mini-environment in a manufacturing facility.

While the invention of the co-pending application addresses many existing problems, there are other problems that are not readily fixed by providing multiple doors for access. First, multiple doors may add weight and complexity to the pod (with possible increase in the cost of construction and maintenance) that may not be necessary for some applications. Second, there are instances where it may be necessary to connect the same side of a pod to different interfaces (e.g., where a pod must interface with different bottom load mechanisms). In these instances, multiple doors do not readily address the problems confronted by the manufacturing facility designer.

For example, a problem has emerged in the logistics of removing wafers from one cassette, processing the wafers, and returning the wafers to another cassette for further transportation or storage. One popular method of handling wafers in a cassette-to-cassette application is to place the full cassette on a send indexer and an empty cassette on a receive indexer. The send indexer lowers the cassette into an indexer well until the bottom wafer is available to the single wafer load mechanism of the tool. At the same time, the empty cassette on the receive indexer is lowered until the top slot is available to the single wafer unload indexer. After the bottom wafer is removed for processing, the send indexer lowers by one cassette slot to make the next wafer available to the single wafer load mechanism. Upon completion of processing, the tool's single wafer unload mechanism places the wafer in the top slot of the receive cassette whereupon the receive indexer rinses by one slot to make the second slot available to the tool's unload mechanism. These cycles of lowering the send indexer and raising the receive indexer continues until all wafers in the send cassette have been processed by the tool and are placed in the receive indexer.

Interfacing the SMIF system to an indexer type process tool is typically done either with an automated manipulator, as described above, or a SMIF indexer. An automated manipulator moves the entire cassette from the container and places it on the tool's indexer. This manipulator may be able to reach both the send and receive indexers or separate manipulators may be required for each indexer. Another, more elegant solution is to replace the existing indexers with a SMIF indexer.

The SMIF indexer encompasses both the typical SMIF particle free interface as well as the indexing functions usually performed by an indexer as part of the tool's wafer handling mechanism. In a typical SMIF indexer application, a container with a cassette with wafers is placed on the send SMIF indexer and a container with an empty cassette is placed on the receive SMIF indexer. After latching of the containers in place and releasing the container doors, both cassettes are lowered into the indexer well along with the mated container and interface doors. The send SMIF indexer is lowered until the bottom wafer is available to the tool's single wafer loading mechanism. The receive SMIF indexer is lowered until the top wafer slot is available to the tool's single wafer unloading mechanism. The SMIF indexers then operate similarly to normal indexers allowing the wafers to be removed from the send SMIF indexer, processed in the tool, and placed in the receive SMIF indexer. Upon completion of the wafer processing, both SMIF indexers reseal the containers and release the containers.

While the present indexing applications of the SMIF system can provide a clean and elegant solution to contamination control, their integration into existing process tools is difficult because the overall footprint of a SEMI standard SMIF indexer is considerably larger than the footprint of a non-SMIF indexer. It is desirable to provide a SMIF indexer that fits into existing indexer wells and can be incorporated into the wafer handling mechanism of existing tool designs without major modification of the tools. Further, it is desirable to allow for future tool designs using a smaller indexer footprint. It is also believed desirable for the transport container to be available to be used on either a SEMI standard SMIF device as well is a reduced footprint indexer. None of the problems are addressed by any existing pod system.

Accordingly, it is a primary purpose of the present invention to provide an improved wafer transport container having multiple interface ports.

It is a further purpose of the present invention to provide a wafer transport container that can connect effectively to different interfaces on a single side of the container.

It is still another purpose of the present invention to provide a wafer transport container that can readily connect to different sized interfaces on a single side of the container.

It is yet another purpose of the present invention to provide a wafer transport container that can interface with conventional SEMI standard bottom loading devices while also being able to interface with bottom loaded indexing systems having a reduced foot print.

It is still another purpose of the present invention to provide an improved design for indexers or other tools for interfacing with a container of the present invention.

It is yet another purpose of the present invention to provide an improved design for indexers that allow a cassette or a cassette container to be loaded on the same indexer.

These and other purposes of the present invention will become evident from review of the following specification.

SUMMARY OF THE INVENTION

The present invention is an improved container for transporting contamination sensitive items, such as semiconductor wafers during manufacture. In one of its simplest forms, the container of the present invention comprises an enclosure sealed by a door having multiple access openings. The provision of multiple access openings in a single door allows the container to connect to different interfaces on a clean environment from the same side of the container. For example, a single container or "pod" may include a SEMI standard door for attachment with a complementary SEMI standard interface, and another door within the first door for attachment to one or more different interfaces.

This construction provides many distinct advantages over previous pod constructions. First, by allowing interface from a single side of a pod to two or more different interfaces, pod users are provided with significantly improved flexibility in choosing clean environments and interfaces for use with such environments. In this manner, a change of interface (e.g., size, gaskets, or latch design) on one or more of existing clean environments does not require replacing all of the interfaces on all of remaining environments in a facility and their associated pods. Flexibility is further enhanced by the possibility of allowing existing pods to be retrofitted with new doors of the present invention to provide multiple interface access with minimal additional cost investment. Second, the design of the present invention provides new applications that have previously been unavailable. For instance, a pod can now provide access to both a SEMI standard bottom load interface and provide direct connection to a bottom load tool (e.g., a cassette indexer) that does not employ a SEMI standard interface due to technical issues such as engineering, space, or cost limitations.

In one embodiment of the present invention, a pair of lower container doors is provided, with a smaller, center door of the minimum geometry to match the dimensions of the footprint of a SEMI standard cassette. In SEMI standard SMIF applications of the container, the center and outer doors are latched together and released as a pair to provide lower container access. In reduced footprint applications, latches are released to allow the center door to be lowered with the lowering device holding the outer door in place. This construction is particularly beneficial for allowing a cassette to be readily placed in a tool, with an indexer of reduced dimensions.

In another embodiment of the present invention, an indexer is modified such that all components are outside of the cassette/small door footprint, such that the door with cassette can be lowered into the indexer well, without hitting any components.

In another embodiment of the present invention, the indexer is able to distinguish between a wafer cassette, and a cassette container, such that either a cassette or a cassette container may be placed on the indexer, and the indexer will lower the wafers to the correct height. This construction provides flexibility in fabs where some equipment is "smifed," and other equipment still loads from standard cassettes.

DESCRIPTION OF THE DRAWINGS

The operation of the present invention should become apparent from the following description when considered in conjunction with the accompanying drawings, in which.

DETAILED DESCRIPTION OF THE INVENTION

The present invention is an improved design for providing multiple access ports into a sealed container or "pod" for handling (i.e., transporting, storing, etc.) contamination sensitive items. While it is contemplated that the container of the present invention may be employed in a wide variety of applications, it is particularly suitable for use in handling silicon wafer products during manufacture of semiconductors and similar products that are highly sensitive to damage from contamination by dust particles and other environmental factors during processing.

Figure 1:
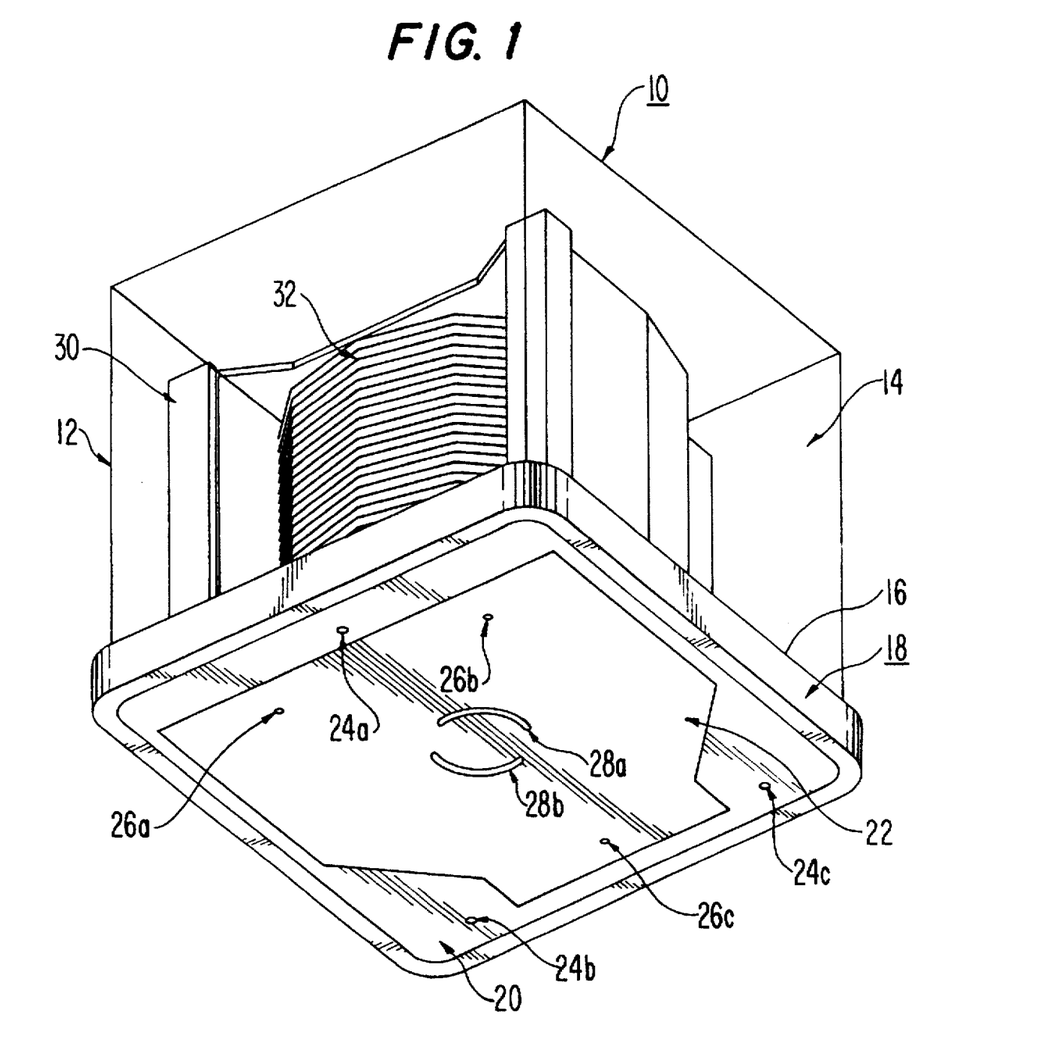
FIG. 1 is a three-quarter isometric view of a container of the present invention, with lower doors shown in a closed position.

Shown in FIG. 1 is a container 10 of the present invention. The container 10 includes an exterior 12, an interior 14, at least one opening 16 on one of its sides, and a door assembly 18 controlling access through the opening 16. In the embodiment shown, the opening 16 is a lower opening adapted for bottom loading into the container 10. The door assembly 18 includes multiple doors therein, a first, outer, door 20 and a second, inner, door 22 embedded within the first door 20. Access to the interior 14 of the container can be accomplished through either of the doors 20 or 22.

The advantage of this construction is that a single side of the container 10 may be attached to two or more different interfaces. This supplies a wide degree of flexibility in the possible uses of the container and its ability to move items between a number of different sealed environments. Of particular interest is the containers ability to attach to existing standard interfaces and still be able to attach to new or different interfaces that may be later adopted. For example, Semiconductor Equipment and Materials International (SEMI) has promulgated standards for the interface port and container door of a Standard Mechanical Interface (SMIF) system. The SEMI-Standards provide a uniform industry standard so that containers and tool canopy interfaces of different manufacturers can be compatible (e.g., SEMI E19, 4-92, 200MM "STANDARD MECHANICAL INTERFACE (SMIF)" published in 1992).

In the embodiment shown, three SEMI-standard SMIF registration holes 24a, 24b, 24c allow for alignment of the container 10 with SEMI standard SMIF systems. Three additional indexer registration holes 26a, 26b, 26c allow for alignment with another interface. Two latching holes 28a, 28b are actuated by a SEMI-standard mechanism or other device in a tool or other clean environment interface to unlatch door 20 or 22.

The second door 22 is shaped to conform with the rough geometry of a footprint of a wafer cassette 30. As is common practice, the wafer cassette 30 is adapted to hold numerous wafers 32 in stacked orientation, as shown.

Figure 2:
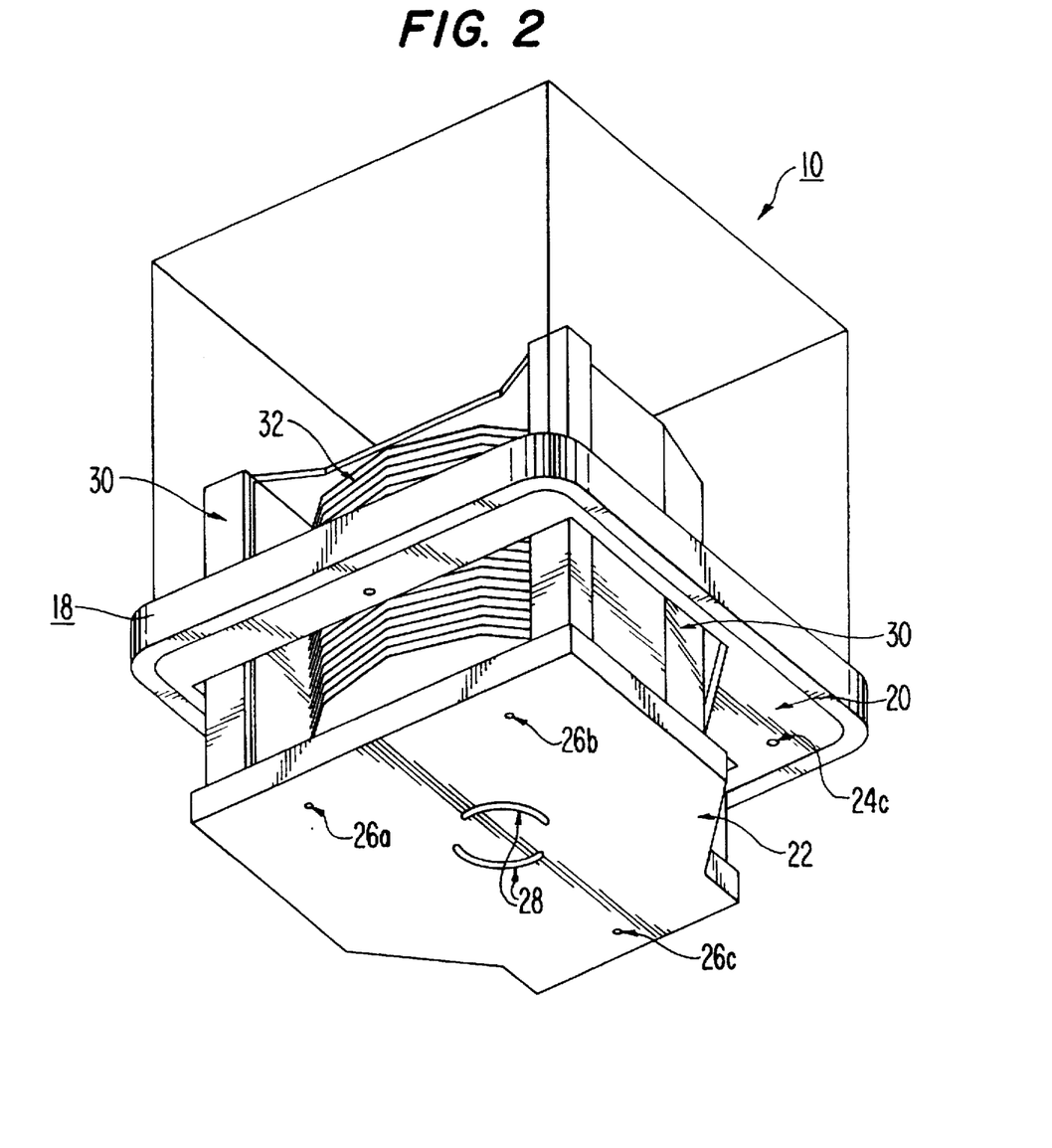
FIG. 2 is a three-quarter isometric view of the container of FIG. 1 with its embedded, center door shown in the open position.

As is shown in FIG. 2, the second door 22 can be separated from the door assembly 18 with the cassette 30 removed simultaneously. By closely duplicating the footprint of the cassette 30, the second door 22 can be opened and removed along with the cassette 30 while eliminating unnecessary clearance around the cassette 30.

Figure 2A:
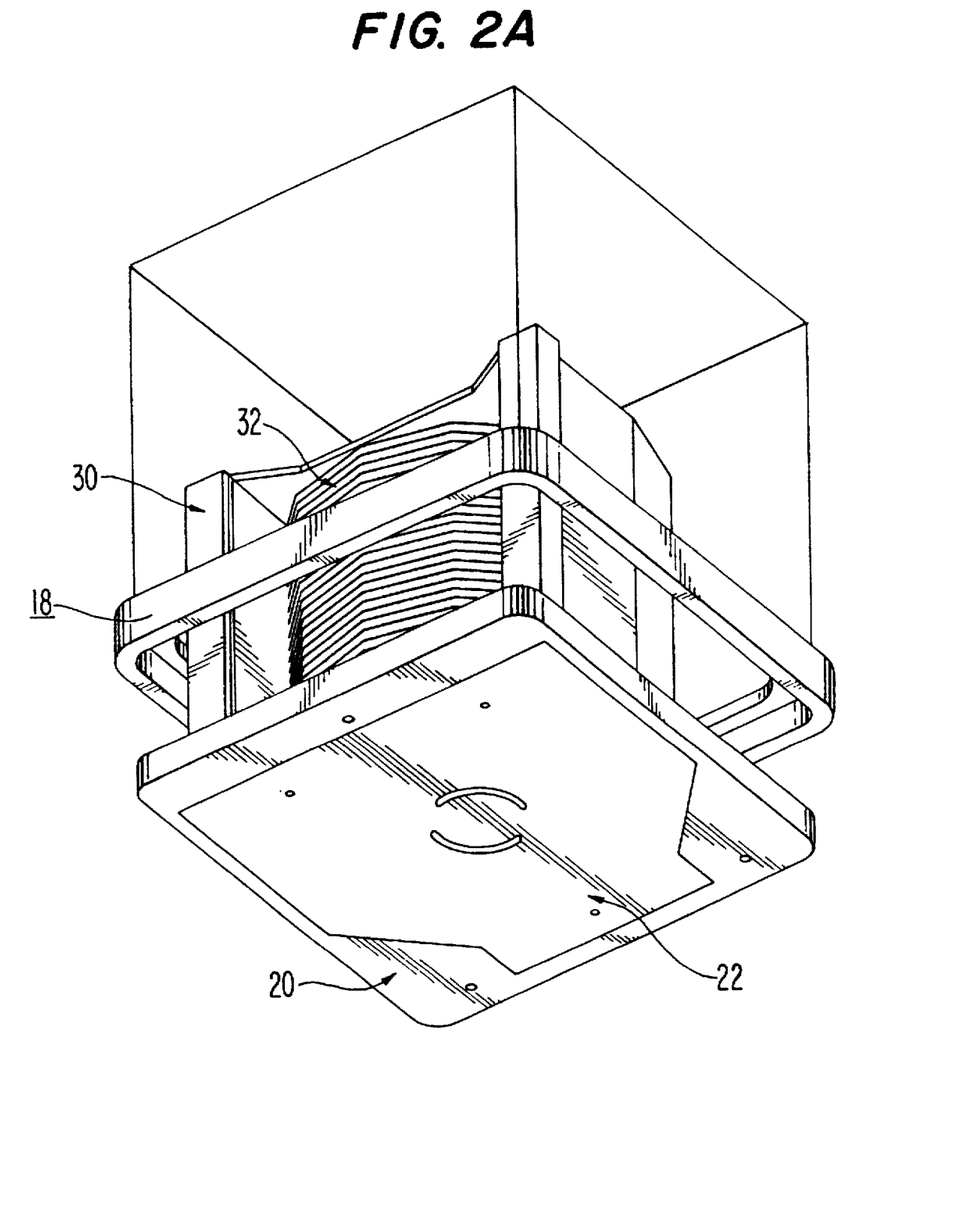
FIG. 2A is a three-quarter isometric view of the container of FIG. 1 with its main, outer door shown in an open position.

Referencing FIG. 2A, the second door 22 remains locked with the first door 20 in door assembly 18. As can be seen, both doors may then be separated from the container simultaneously.

Figure 3:
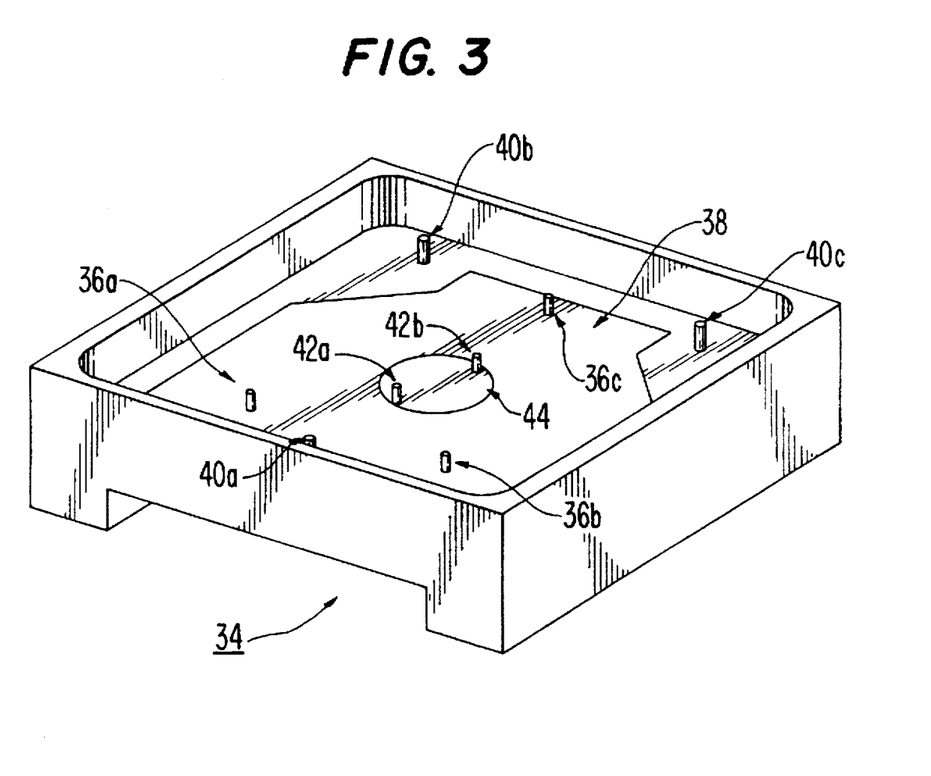
FIG. 3 is a three-quarter isometric view of a door assembly of the present invention.

FIG. 3 shows an interface base 34, such as that which may be incorporated in a mini-environment or a tool. The base 34 includes a location to place the closed container 18 and includes three SEMI standard pins 36a, 36b, 36c, adapted to attach to the three SEMI standard SMIF registration holes 26a, 26b, 26c, respectively, shown in FIGS. 1 and 2. An interface door 38 is provided and includes three indexer registration pins 40a, 40b, 40c that align with the indexer registration holes 24a, 24b, 24c, respectively, shown in FIG. 1. To connect with and actuate latching holes 24a, 24b, a pair of latch pins 42a, 42b are provided in the center of the door 38. As is explained in greater detail below, a latching mechanism 44 for turning latch pins is also provided.

Figure 4:
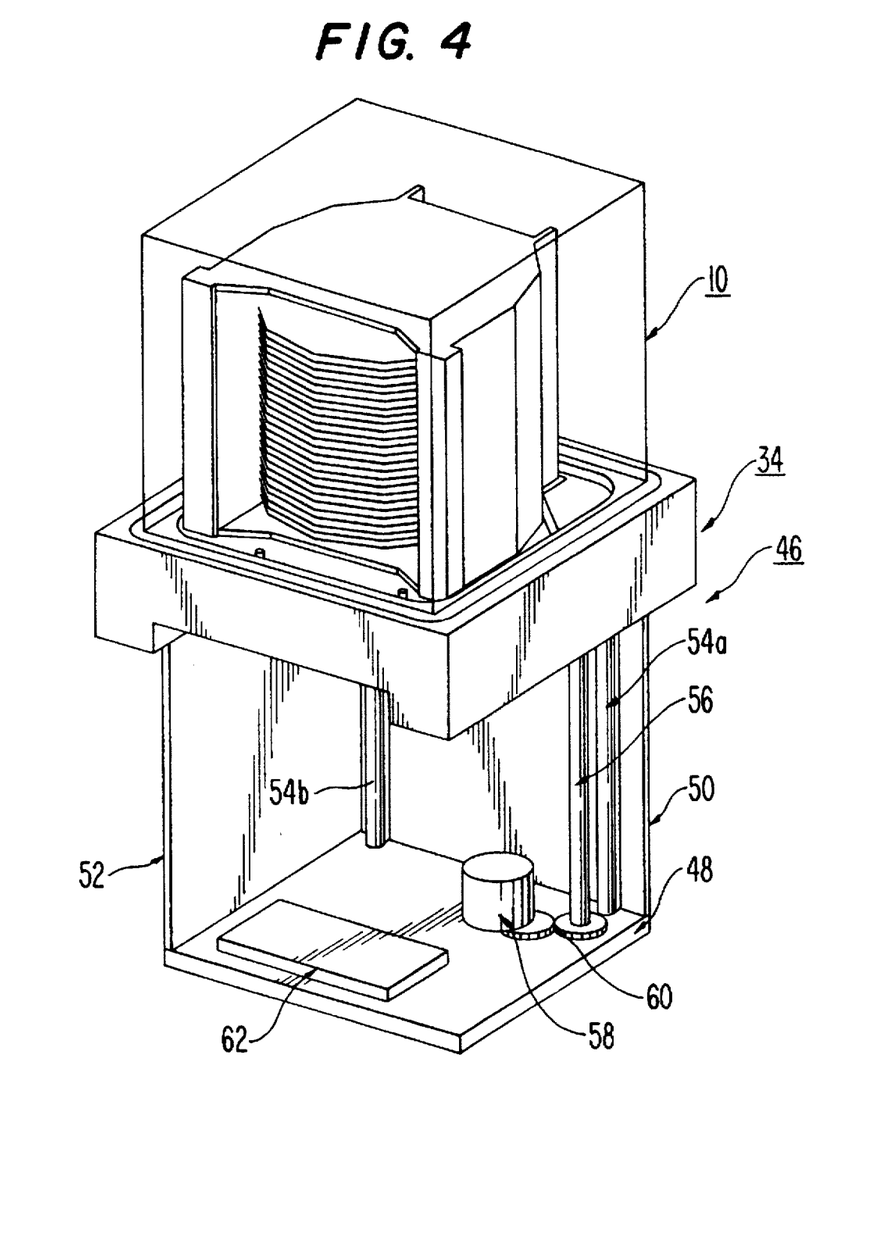
FIG. 4 is a three-quarter isometric view of a container of the present invention mounted on a SMIF indexer, with a cassette shown sealed within the closed container.
Figure 5:
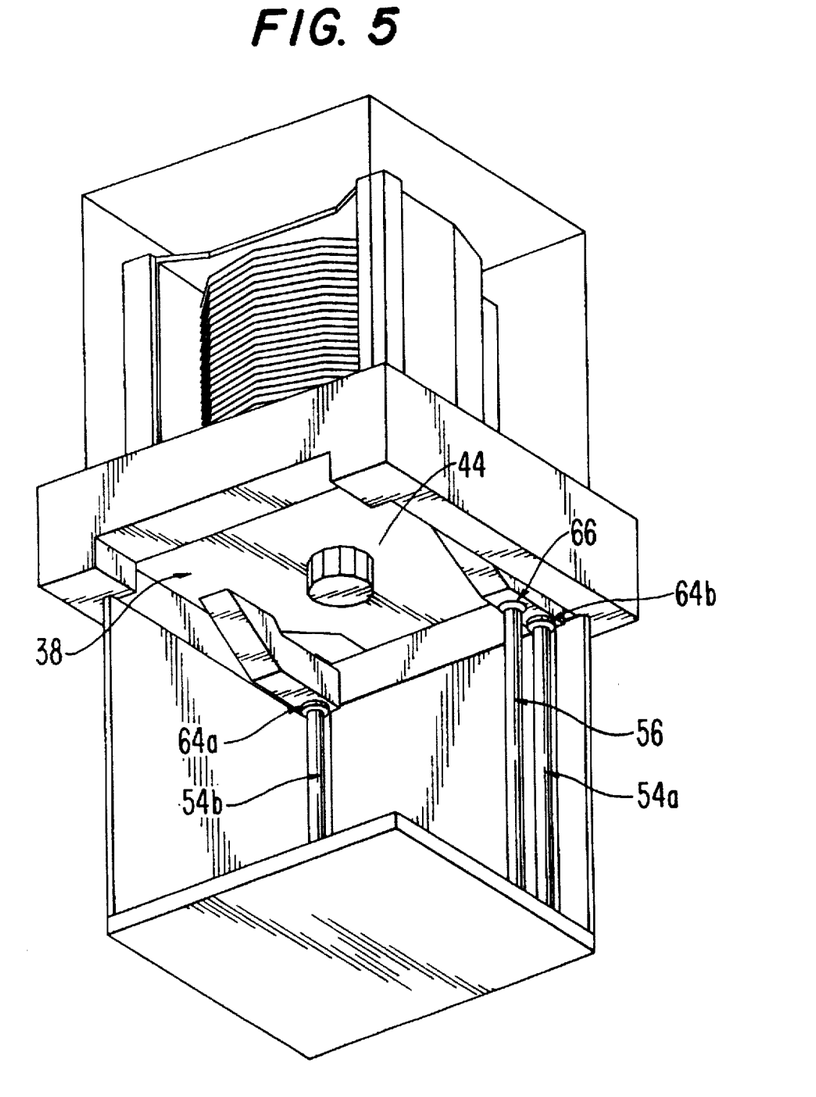
FIG. 5 is a three-quarter isometric view of the container of the present invention mounted on a SMIF indexer, with the cassette shown sealed within the sealed container.

FIGS. 4 and 5 show the container 10 of the present invention, in a closed position, mounted on a tool 46, in this instance an indexer. The container 10 is shown with a wafer cassette 30 and a full load of wafers 32. The container 10 is placed on an interface base 34. A supporting structure for the indexer comprises a baseplate 48, a backplate 50, two side plates 52 (only one shown for clarity), and the interface base 34.

Means should be provided to actuate the cassette 30 into and out of the container 10. In this instance a unique actuation mechanism is provided whereby the actuating means is positioned completely outboard of the footprint of the cassette, allowing door 22 to be lowered directly into the tool without interference from conventional in-board actuating means normally employed in commercially available indexers. The indexer tool comprises two bearing shafts 54a, 54b and a lead screw 56, each mounted toward the outside of the tool. The lead screw 56 is driven by a motor 58 through a series of gears 60. Electronic circuitry 62 controls the motor 58 as well as the latch pin actuator 44.

Upon latching of the container 10 to the interface base 34 and unlatching the bottom door 22 from the container 10, via the latch pin actuator 44, the assembly consisting of the interface door 38, bottom door 22, and wafer cassette 30 are free to move vertically on the two bearing shafts 54a, 54b as driven by the lead screw 56. The two linear bearings 54 are rigidly attached to the interface door 38 at 64a, 64b as well as to a lead screw follower 66.

Figure 6:
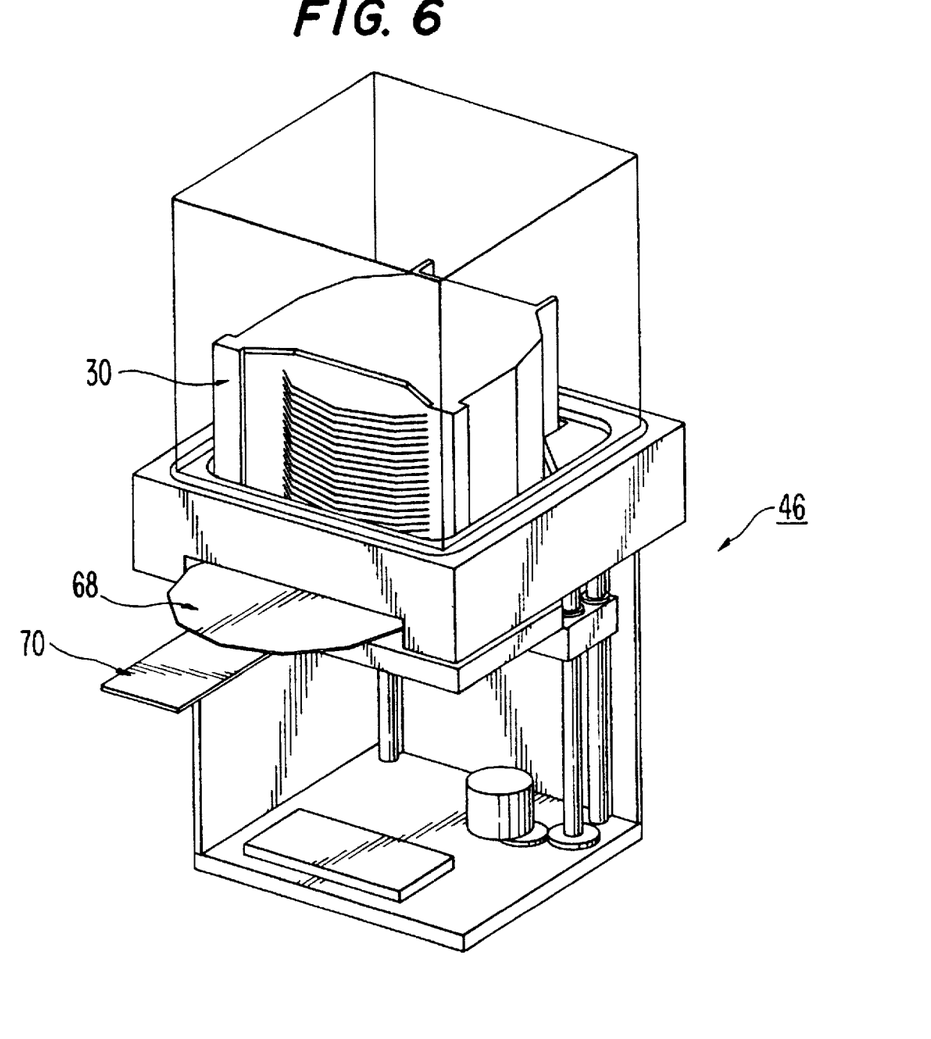
FIG. 6 is a three-quarter isometric view the container of the present invention mounted on a SMIF indexer, with the cassette shown partially removed from the container and with a wafer shown partially removed from the cassette.
Figure 7:
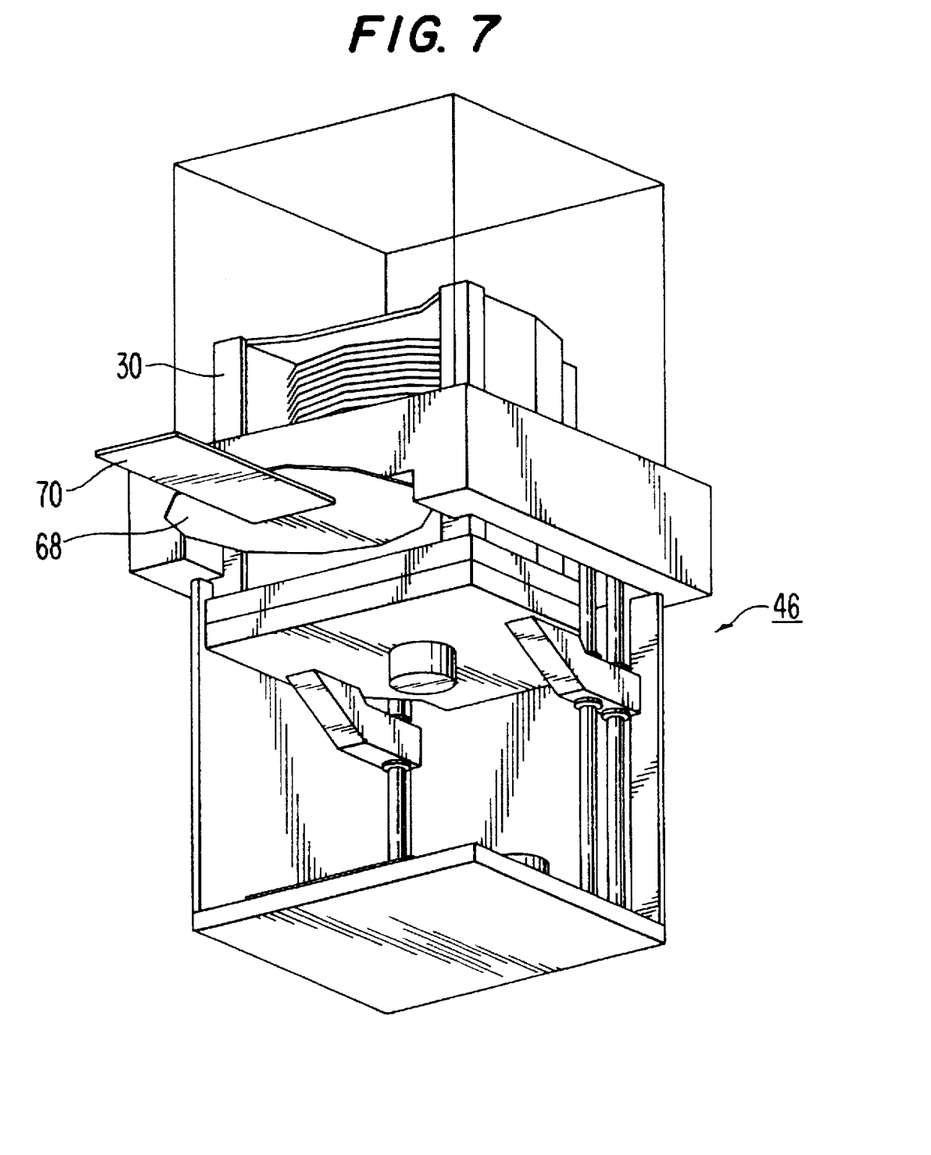
FIG. 7 is a three-quarter isometric view of the container and indexer shown in FIG. 6 from a lower angle.
Figure 8:
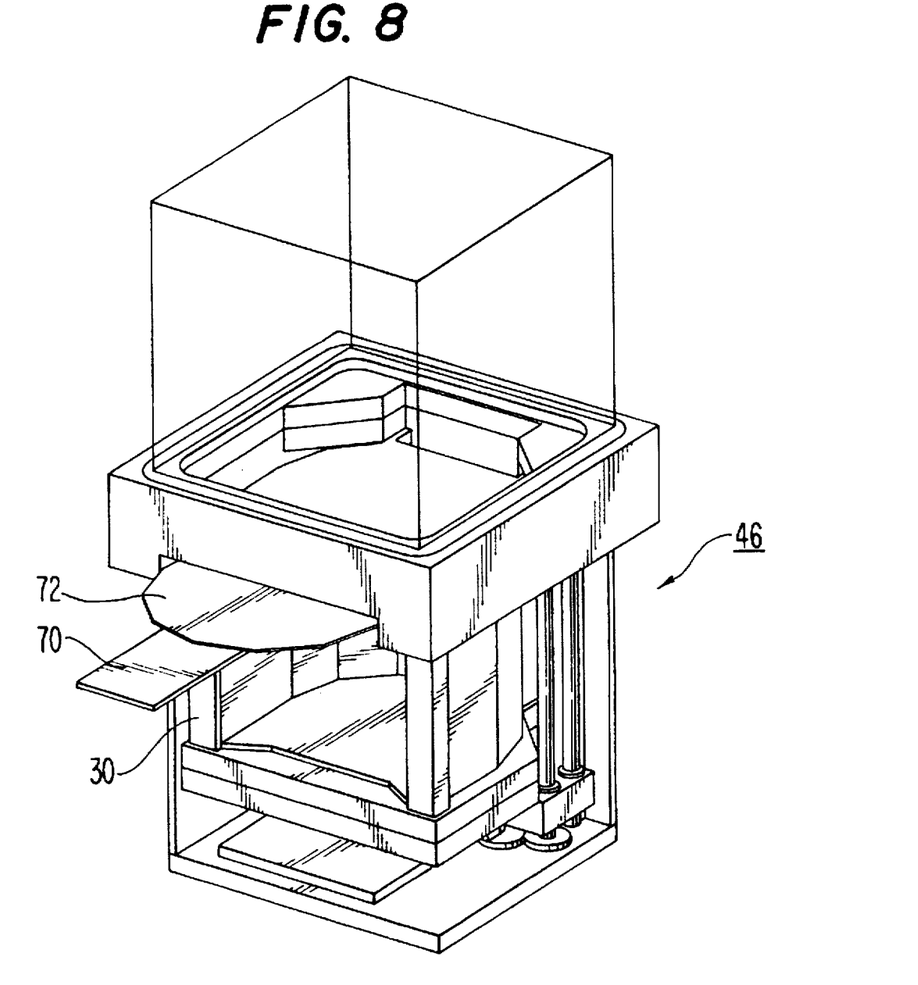
FIG. 8 is a three-quarter isometric view of the container of the present invention mounted on a SMIF indexer, with a cassette shown fully removed from the container and with a wafer shown partially removed from the cassette.
Figure 9:
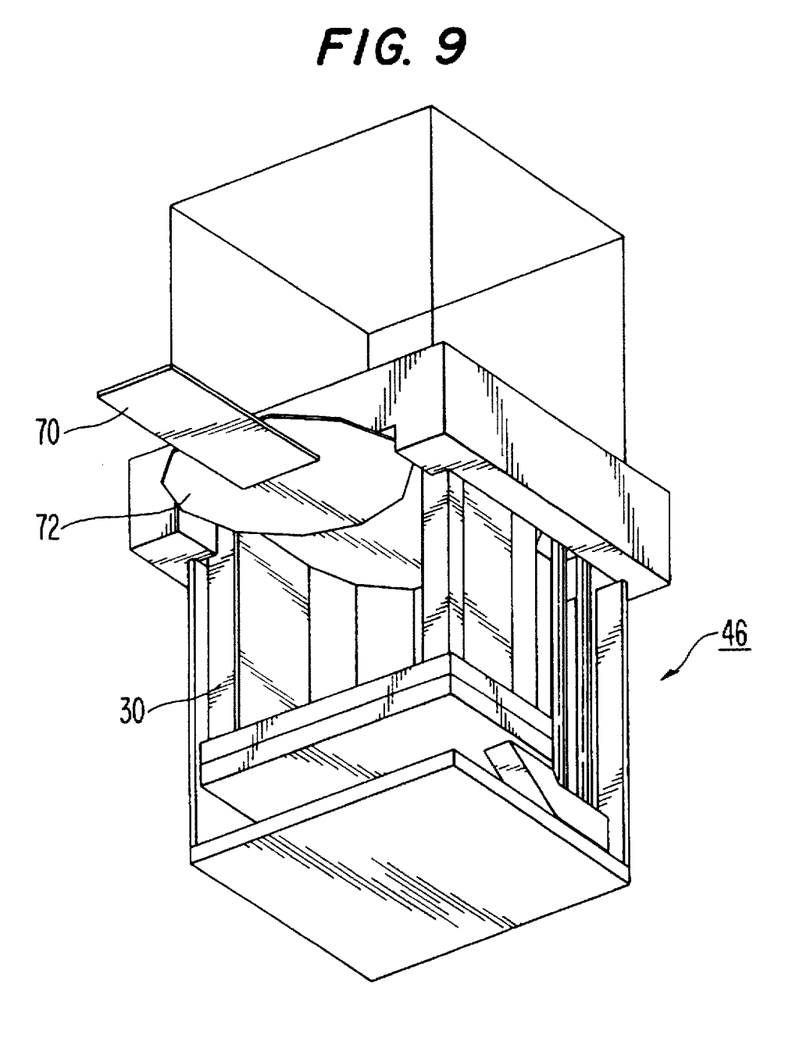
FIG. 9 is a three-quarter isometric view of the container and indexer shown in FIG. 8 from a lower angle.

FIGS. 6 and 7 show an indexer tool 46 in a position to load/unload a bottom wafer 68 from cassette 30. A single wafer handling mechanism 70 from a host tool is shown either extracting or placing a wafer to/from the bottom slot in the wafer cassette. FIGS. 8 and 9 show the indexer in position to load/unload a top wafer 72 similarly.

Figure 10:
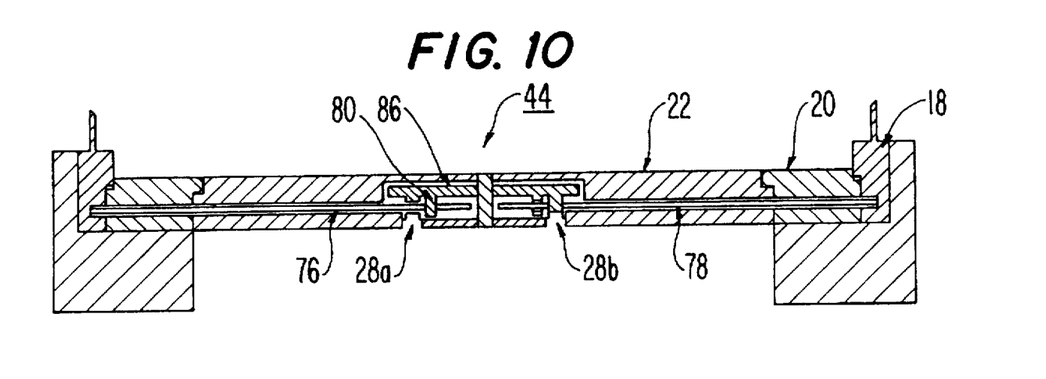
FIG. 10 is a section view of a door assembly of the present invention, showing a latching mechanism inside the bottom doors.
Figure 11:
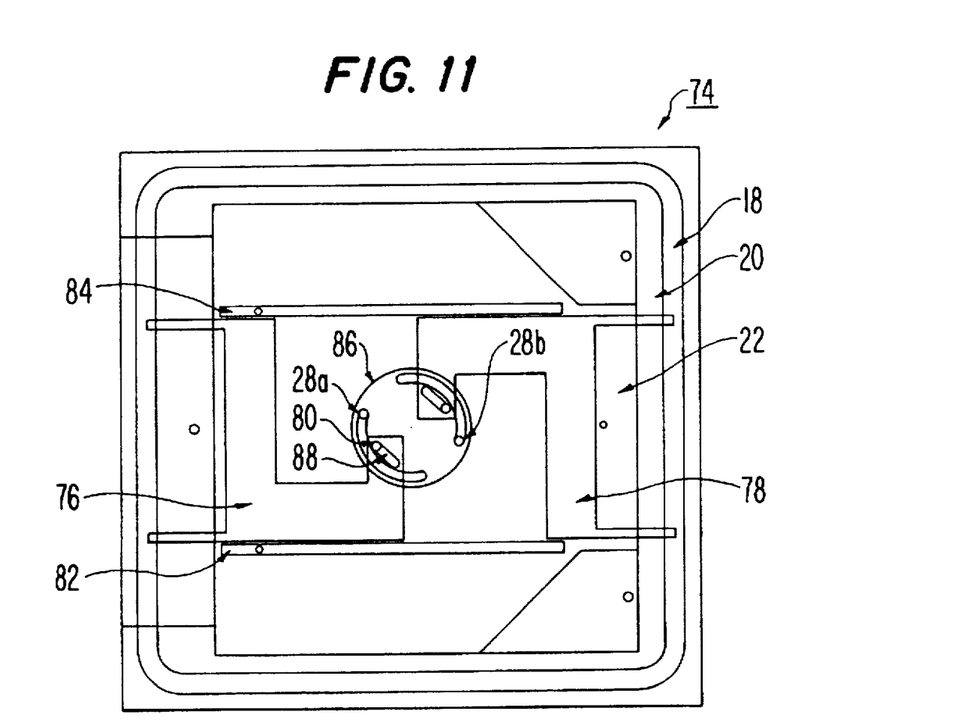
FIG. 11 is a top plan view of a door assembly of the present invention, with the latching mechanism for the outer door in a locked position and the latching mechanism for the center door in a released position.

FIGS. 10 and 11 show an embodiment of a latching mechanism 44 suitable for use in the present invention. In this case, the latching mechanism 44 is shown in a closed position, where both the outer door 20 and the inner door 22 are latched to the door assembly 18. A pair of latch plates 76, 78 move horizontally, driven by the latch cam pins 80 and constrained vertically by guide mils 82, 84. The latching mechanism is driven by SEMI standard pins that mate with latch holes 28a, 28b, pad of the latch cam 86. The latch cam 86 is rotated by interface pins 42a, 42b, previously described, turning the cam latch pins 80 inside the latch plate slots 88. This rotational movement is translated into horizontal movement of the latch plates 76, 78.

Figure 12:
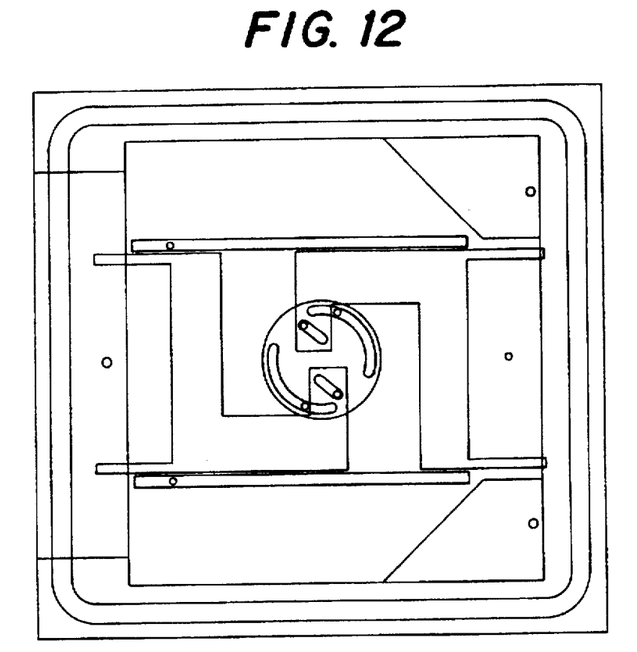
FIG. 12 is a top plan view of the door assembly of the present invention, with the latching mechanism for the outer door in a released position and the latching mechanism for the center door in a locked position.

The initial rotation of the cam latch 86 moves the latch plates 76, 78 clear of the door assembly 18, releasing outer door 20 from the door assembly 18 while continuing to latch inner door 22 with outer door 20. This position is shown in FIG. 12.

Figure 13:
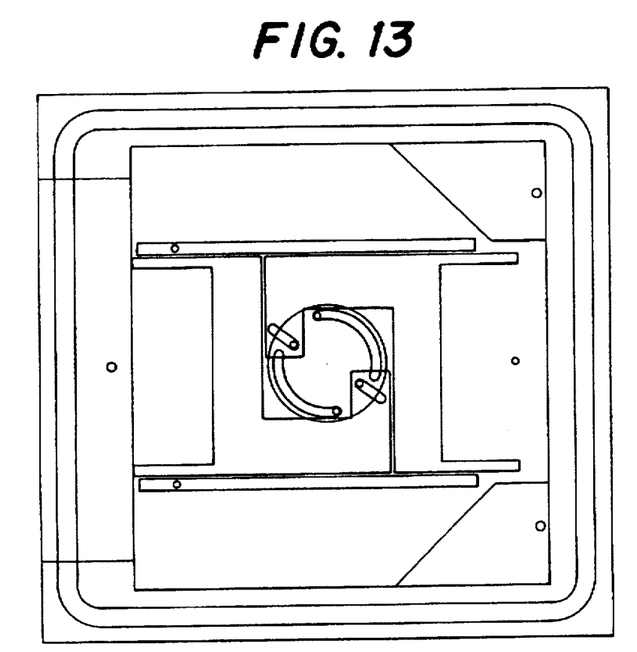
FIG. 13 is a top plan view of the door assembly of the present invention, with the latching mechanisms for both doors in a released position.

Further turning of the latch cam 86 moves the latch plates 76, 78 further towards the center of the doors until the inner door 22 is unlatched from the outer door 20. This position is shown in FIG. 13.

It should be appreciated that the above described latching mechanism is only illustrative of one mechanism that may be used with the present invention. Other suitable latches may be likewise employed without departing from the intent of the present invention.

Figure 14:
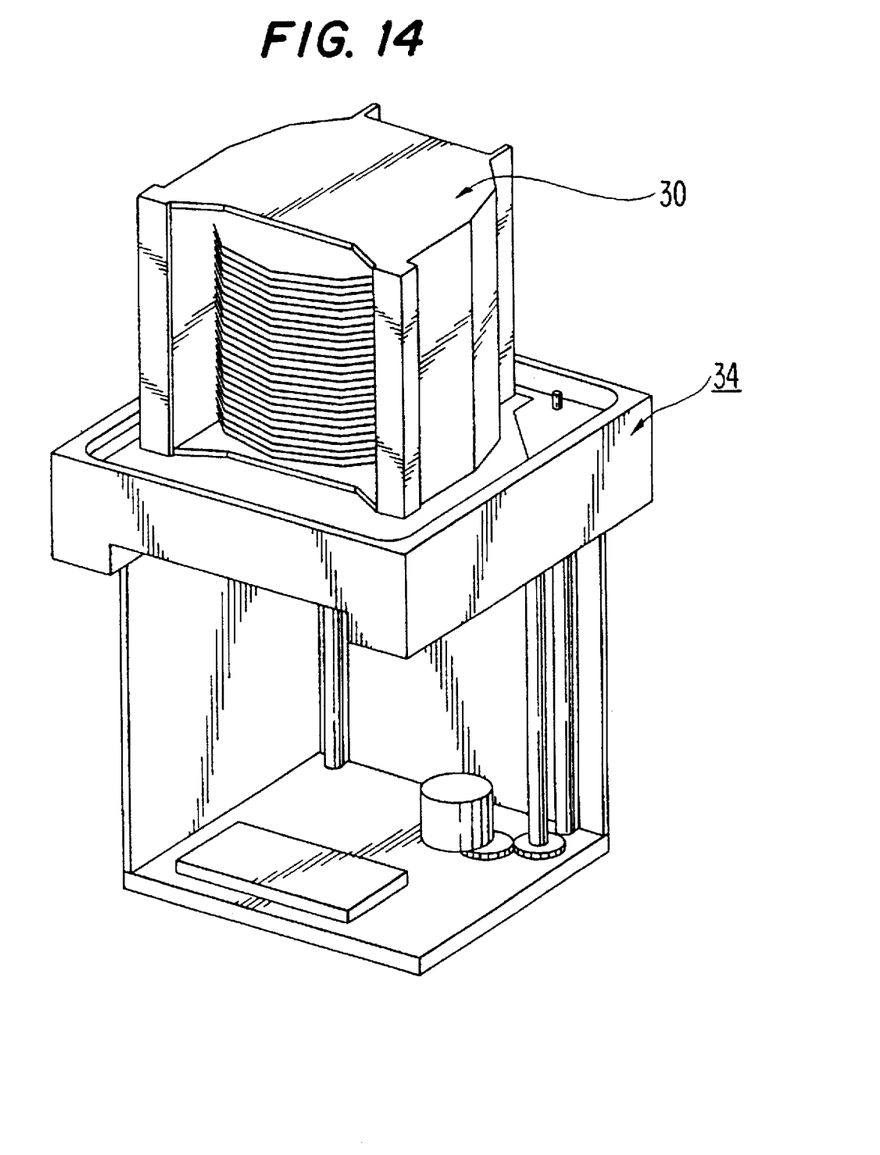
FIG. 14 is a three-quarter isometric view of an indexer of the present invention showing a wafer cassette loaded directly on the same indexer as shown in FIG. 4.

A preferred embodiment of the present invention allows not only a wafer container 10 to be placed onto the interface base 34, but also allows a cassette 30 to be placed directly on the interface base 34 as well, as shown in FIG. 14. This capability allows manufacturing flexibility by allowing both semi standard containers as well as cassettes to be loaded directly on the same indexer/tool. With this capability, a facility need not change over entirely to cassette containers and dedicated cassette container indexers.

Referring to FIG. 3, interface pins 42a and 42b are spring loaded such that cassette 30 can be placed directly on interface base 34 without interfering with interface pins 42a and 42b. Interface pins 42a and 42b, when depressed, activate a switch such that the indexing motions take into account that a cassette, which holds wafers ½ inch lower than a container, has been loaded.

It should be appreciated that the use of the depressed interface pins as a means of detecting a cassette versus a cassette container is only illustrative of one mechanism that may be used with the present invention. Other suitable cassette detection means may likewise be employed without departing from the intent of the present invention.

Generally, SEMI standard latch pins are spring loaded and will depress when a cassette is placed directly on the interface. Depression of these latch pins actuate electronics that allow the cassette to be directly loaded and unloaded on the indexer. Thus, this indexer is capable of loading and unloading wafers from pods or directly from cassettes. This allows a single indexer.

The container of the present invention can be made from any suitable material compatible with the materials being transported and the environments where it will be employed. For instance, for use in semi-conductor handling, the container may be constructed from materials such as polycarbonate, and carbon-filled polycarbonates.

It should be evident from the above description that the container of present invention may be modified to address particular applications. For some uses, it may be desirable to provide interfaces to other standard interface designs now existing or later developed. Additionally, there may be times where the second, embedded, door should be SMIF compatible, with an outer door providing connection to a different environment interface. The scope of the present invention should be read accordingly.

While particular embodiments of the present invention have been illustrated and described herein, the present invention should not be limited to such illustrations and descriptions. It should be apparent that changes and modifications may be incorporated and embodied as part of the present invention within the scope of the following claims.

The invention claimed is:

1. An assembly for handling contamination-sensitive products between clean environments comprising:
   a container having at least one opening therein sealed by a door;
   a first latch on the door to access a first interface opening and for connecting to a first port on a first clean environment;
   a second latch on the door to access a second interface opening and for connecting to a second port on a second clean environment, the second port being incompatible with the first latch on the door;
   wherein the container can be interfaced with the first port by connecting the first latch with the first port, and the container can be interfaced with the second port by connecting the second latch with the second port; and
   a tool having an opening adapted to receive contamination-sensitive product wherein the tool lowers the contamination-sensitive products into an enclosed area within the tool;
   and the tool receives the contamination-sensitive products and a portion of the door through the opening in the tool as the tool lowers the contamination-sensitive products.

2. The assembly of claim 1 wherein the opening in the tool corresponds to SEMI standard conditions for a footprint of a cassette designed to hold integrated circuit chips.

3. The assembly of claim 2 wherein the tool comprises an indexer, providing incremental lowering and raising of the cassette.

4. The assembly of claim 3 wherein the indexer includes actuation means oriented outboard of the cassette in a lowered position.

5. The assembly of claim 1 wherein the tool includes means to accept and operate with different containers.

6. The assembly of claim 5 wherein the tool will accept and operate with a container comprising a cassette with no housing surrounding it.

7. The assembly of claim 1 wherein the tool will accept and operate with a container comprising a cassette with no housing surrounding it.

8. An assembly for handling contamination-sensitive items between clean environments comprising:
   an enclosure having an interior, an exterior, and at least one opening therein;
   a first door sealing the first opening in the enclosure, the first door connecting to a first interface on a clean environment and providing access between the interior of the enclosure and and the clean environment;
   a second door embedded within the first door, the second door connecting to a second interface on a clean environment and providing access between the interior of the enclosure and the clean environment; and
   a tool having an opening adapted to receive contamination-sensitive items wherein the tool lowers the contamination-sensitive items into an enclosed area within the tool and the tool receives the contamination-sensitive items and the second door through the opening in the tool as the tool lowers the contamination-sensitive items.

9. The assembly of claim 8 wherein the opening in the tool and the dimensions of the second door correspond to SEMI standard dimensions for a footprint of a cassette.

10. The assembly of claim 8 wherein the tool comprises an indexer, providing incremental lowering and raising of a cassette.

11. The assembly of claim 10 wherein the indexer includes actuation means oriented outboard of the cassette in a lowered position.

* * * * *